(12) United States Patent
Lee

(10) Patent No.: US 9,124,268 B2
(45) Date of Patent: Sep. 1, 2015

(54) SEMICONDUCTOR DEVICE WITH CLOCK-BASED SIGNAL INPUT CIRCUIT

(71) Applicant: SK hynix Inc., Gyeonggi-do (KR)

(72) Inventor: Hyun-Woo Lee, Gyeonggi-do (KR)

(73) Assignee: SK HYNIX INC., Gyeonggi-do (KR)

( * ) Notice: Subject to any disclaimer, the term of this patent is extended or adjusted under 35 U.S.C. 154(b) by 0 days.

(21) Appl. No.: 14/099,542

(22) Filed: Dec. 6, 2013

(65) Prior Publication Data

US 2014/0312940 A1   Oct. 23, 2014

(30) Foreign Application Priority Data

Apr. 22, 2013   (KR) .................. 10-2013-0044313

(51) Int. Cl.
*H03L 7/00*   (2006.01)
*H03K 19/0185*   (2006.01)
(52) U.S. Cl.
CPC .............................. *H03K 19/018521* (2013.01)
(58) Field of Classification Search
USPC ......................................... 327/141, 144, 154
See application file for complete search history.

(56) References Cited

U.S. PATENT DOCUMENTS

| | | | | |
|---|---|---|---|---|
| 3,796,893 A | * | 3/1974 | Hoffman et al. | 326/70 |
| 4,063,118 A | * | 12/1977 | Nishimura | 326/106 |
| 4,110,639 A | * | 8/1978 | Redwine | 326/70 |
| 4,149,099 A | * | 4/1979 | Nagami | 327/213 |
| 6,166,990 A | * | 12/2000 | Ooishi et al. | 365/233.11 |
| 2011/0291712 A1 | * | 12/2011 | Tobita | 327/144 |

FOREIGN PATENT DOCUMENTS

| | | |
|---|---|---|
| KR | 100736396 | 7/2007 |
| KR | 1020090003685 | 1/2009 |
| KR | 1020100067806 | 6/2010 |

\* cited by examiner

*Primary Examiner* — William Hernandez
(74) *Attorney, Agent, or Firm* — IP & T Group LLP

(57) ABSTRACT

A semiconductor device includes a signal input circuit suitable for synchronizing an input signal with a clock signal and receiving the clock signal as a power source when the input signal has a first phase, where the signal input circuit amplifies a swing width of the input signal based on a swing width of the clock.

11 Claims, 4 Drawing Sheets

SEMICONDUCTOR DEVICE WITH CLOCK-BASED SIGNAL INPUT CIRCUIT

CROSS-REFERENCE TO RELATED APPLICATIONS

The present invention claims priority of Korean patent application number 10-2013-0044313, filed on Apr. 22, 2013, which is incorporated by reference in its entirety.

BACKGROUND

1. Field

Exemplary embodiments of the present invention relate to an integrated circuit design technology, and more particularly, to a semiconductor device with a clock-based signal input circuit.

2. Description of the Related Art

Recently, an energy harvesting technology has been introduced to a semiconductor system. The energy harvesting technology produces and provides a power from a peripheral energy source. The harvesting technology includes a method for producing a power from a solar energy using a solar cell, a heat energy using a Seeback effect, and a vibration energy using a Faraday's law of electromagnetic induction or a piezoelectric effect, or a magnetostriction effect.

However, since a power, which is generated using the energy harvesting technology, is used limitedly, it is not easy to use in a high speed operation and a low power supply of a semiconductor system.

SUMMARY

Exemplary embodiments of the present invention are directed to a semiconductor device with a signal input circuit suitable for minimizing a power consumption.

In accordance with an exemplary embodiment of the present invention, a semiconductor device includes a signal input circuit suitable for synchronizing an input signal with a clock signal and receiving the clock signal as a power source when the input signal has a first phase.

In accordance with an exemplary embodiment of the present invention, a semiconductor device includes a first synchronization unit suitable for synchronizing an input signal with a first clock, and for receiving a second clock signal as a power source when the input signal has a first phase, a second synchronization unit suitable for synchronizing a first synchronized signal outputted from the first synchronization unit with the second clock signal, and for using the first clock signal as the power source when the first synchronized signal has the first phase, and a latch unit suitable for latching a second synchronized signal outputted from the second synchronization unit.

In accordance with an exemplary embodiment of the present invention, a semiconductor device includes a first synchronization unit suitable for synchronizing an input signal with a first clock signal and for using a second clock signal as a power source when the input signal has a first phase, a second synchronization unit suitable for synchronizing a first synchronized signal outputted from the first synchronization unit with the first clock signal and for using a power supply voltage as the power source when the first synchronized signal has the first phase, a latch unit suitable for latching a second synchronized signal outputted from the second synchronization unit.

In accordance with an exemplary embodiment of the present invention, a semiconductor device includes a first pull-up driving unit suitable for pull-up driving a first node using a first clock signal as a power source based on an input signal, a first switching unit suitable for selectively coupling the first pull-up driving unit to the first node based on a second clock signal a first pull-down driving unit suitable for pull-down driving the first node with a ground voltage based on the input signal, a second pull-up driving unit suitable for pull-up driving a second node using the first clock signal as the power source based on a first synchronized signal transferred through the first node, a second switching unit suitable for selectively coupling the second node to the second pull-up driving unit based on the second clock signal, a second pull-down driving unit suitable for pull-down driving the second node with the ground voltage based on the first synchronized signal, a third switching unit suitable for selectively coupling the second pull-down driving unit to a ground voltage terminal, a third pull-up driving unit suitable for pull-up driving a third node using the second clock signal as the power source based on a second synchronized signal transferred through the second node, a third pull-down driving unit suitable for pull-down driving the third node with the ground voltage based on the second synchronized signal, a fourth switching unit suitable for selectively coupling the third pull-down driving unit to the third node based on the first clock and a latch unit suitable for latching a third synchronized signal transferred through the third node.

In accordance with an exemplary embodiment of the present invention, a semiconductor device includes a first pull-up driving unit suitable for pull-up driving a first node using a first clock signal as a power source based on an input signal, a first switching unit suitable for selectively coupling the first pull-up driving unit to the first node based on a second clock signal, a first pull-down driving unit suitable for pull-down driving the first node with a ground voltage based on the input signal, a second pull-up driving unit suitable for pull-up driving a second node using the first clock signal as the power source based on a first synchronized signal transferred through the first node, a second switching unit suitable for selectively coupling the second node to the second pull-up driving unit based on the second clock signal, a second pull-down driving unit suitable for pull-down driving the second node with the ground voltage based on the first synchronized signal, a third switching unit suitable for selectively coupling the second pull-down driving unit to a ground voltage terminal, a third pull-up driving unit suitable for pull-up driving a third node using a power supply voltage as the power source based on a second synchronized signal transferred through the second node, a third pull-down driving unit suitable for pull-down driving the third node with the ground voltage based on the second synchronized signal, a fourth switching unit suitable for selectively coupling the third pull-down driving unit to the third node based on the second clock signal, and a latch unit suitable for latching a third synchronized signal transferred through the third node.

In accordance with an exemplary embodiment of the present invention, a semiconductor device includes a clock mixing unit suitable for mixing a phase of a first clock signal with a voltage level of a second clock signal, and an input unit suitable for receiving an external signal using an output signal of the clock mixing unit as a power source.

In accordance with an exemplary embodiment of the present invention, a semiconductor device includes a loading unit suitable for generating a power source having a predetermined voltage level by mixing phases of differential clocks, a differential input unit coupled between a ground voltage terminal and the loading unit, and suitable for receiving the differential clocks, and a sinking unit suitable for selectively coupling the differential input unit and the ground voltage terminal based on an enable signal.

In accordance with an exemplary embodiment of the present invention, a semiconductor system includes a power supply device configured to supply an external power voltage, and a semiconductor device configured to use the external power voltage and an external clock as a source power when an external signal is synchronized with the external clock and is received.

In accordance with an exemplary embodiment of the present invention, a semiconductor system includes a power supply device configured to supply an external power voltage, and a semiconductor device configured to perform a predetermined operation using the external power, wherein the semiconductor device includes an input circuit configured to receive a predetermined signal using an external input clock as a source power, and an internal circuit configured to perform the predetermined operation using the external power voltage as the source power in response to the signal transferred from the input circuit.

In accordance with an exemplary embodiment of the present invention, a semiconductor device includes an input pad, and a signal input circuit suitable for sensing the input signal received through the input pad based on differential clock signals, wherein the differential clock signals are used as a first power source of the signal input circuit.

In accordance with an exemplary embodiment of the present invention, a semiconductor device includes a first input pad and a second input pad, a dock input unit suitable for sensing a clock signal received through the first input pad based on a complementary clock signal received through the second input pad, and a clock mixing unit suitable for mixing phases of the clock signal and the complementary clock signal and for outputting the mixed phases of the clock signal as a power source of the signal input unit.

DETAILED DESCRIPTION

Figure 1:
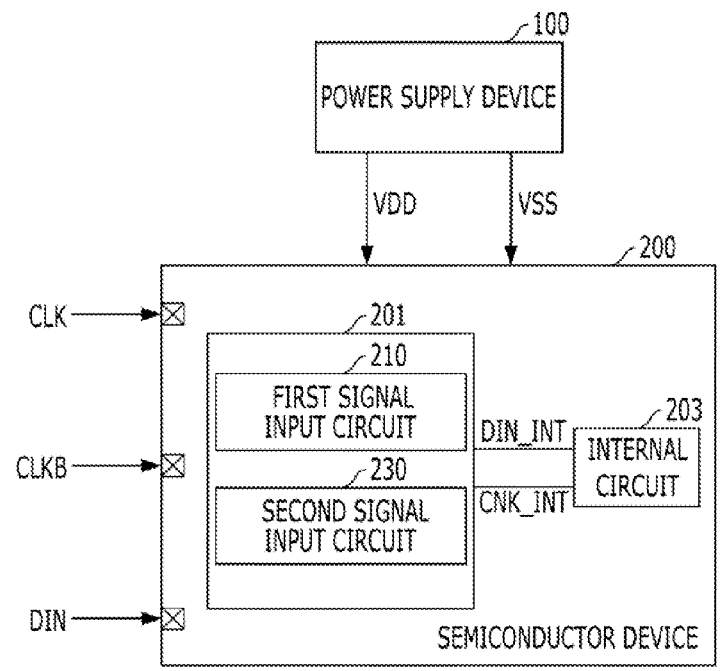
FIG. 1 is a block diagram illustrating a semiconductor system in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

FIG. 1 is a block diagram illustrating a semiconductor system in accordance with an embodiment of the present invention.

Referring to FIG. 1, the semiconductor system may include a power supply device 100 and a semiconductor device 200. The power supply device 100 generates and supplies a power supply voltage VDD and a ground voltage VSS, and may include an energy harvesting component for generating and supplying a power from a peripheral energy source. For example, the power supply device 100 may include a solar cell.

The semiconductor 200 uses the power supply voltage VDD and the ground voltage VSS as a power source, and performs a predetermined operation based on a pair of clock signals CLK and CLKB and input data DIN that are inputted from the external, for example, a memory controller.

The semiconductor 200 includes a signal input circuit 201 and an internal circuit 203. The signal input circuit 201 receives the pair of clock signals CLK and CLKB as the power source, and includes a first signal input circuit 210 and a second signal input circuit 230.

The first signal input circuit 210 receives an input signal, for example, the input data DIN, by using the pair of clock signals CLK and CLKB as the synchronization signal and the power source. The second signal input circuit 230 receives the clock signal CLK by using the complementary clock signal CLKB as the differential signal, and a voltage that is generated by using the pair of clock signals CLK and CLKB is used as the power source.

Here, the input data DIN and the pair of clock signals CLK and CLKB may be transferred to the semiconductor device through the respective input pads.

Meanwhile, the internal circuit 203 receives an internal input data DIN_INT and an internal clock signal CLK_INT outputted from the first signal input circuit 210 and the second signal input circuit 230 and performs a predetermined operation by using the internal input data DIN_INT and the internal clock signal CLK_INT.

Figure 2:
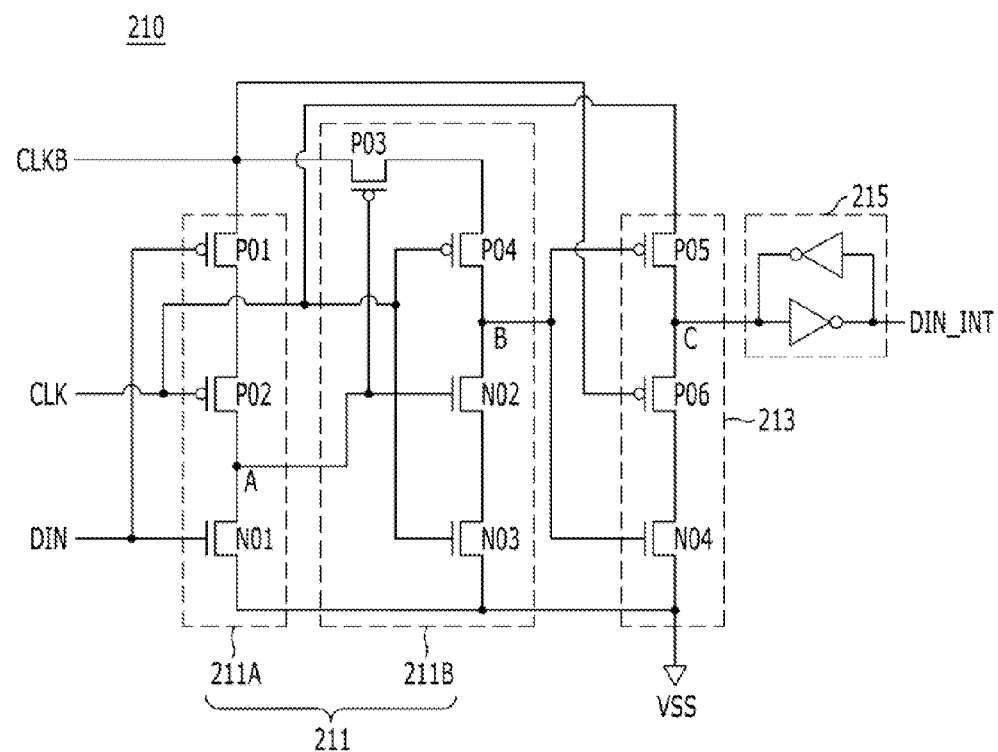
FIG. 2 is a detailed diagram illustrating an example of a first signal input circuit shown in FIG. 1.

FIG. 2 is a detailed diagram illustrating an example of the first signal input circuit 210 shown in FIG. 1.

Referring to FIG. 2, the first signal input circuit 210 may include a first synchronization unit 211, a second synchronization unit 213 and a latch unit 215.

The first synchronization unit 211 synchronizes (or senses) and outputs the input data DIN with a clock signal (or a positive clock signal) CLK of a pair of clock signals CLK and CLKB, and receives a complementary clock signal (or a negative clock signal) CLKB of the pair of clock signals CLK and CLKB as a power source when the input data DIN has a first phase, for example, a logic low level. The second synchronization unit 213 synchronizes or senses) and outputs a first synchronized data B, which is outputted from the first synchronization unit 211, with the complementary clock signal CLKB, and receives the clock signal CLK as a power source when the first synchronized data B has the logic low level. The latch unit 215 latches a second synchronized data C outputted from the second synchronization unit 213 and outputs the internal input data DIN_INT.

Herein, the first synchronization unit 211 includes a first transfer unit 211A and a second transfer unit 211B. If the input data DIN is shifted from a second phase, for example, a logic high level, to the logic low level, the first transfer unit 211A synchronizes (or senses) the input data DIN with the clock signal CLK and outputs a synchronized data as a third synchronized data A having the logic high level. The first transfer unit 211A receives the complementary clock signal CLKB as the power source.

The first transfer unit 211A includes a first pull-up driving unit P01, a first switching unit P02 and a first pull-down driving unit N01. The first pull-up driving unit P01 pull-up drives an output node of the third synchronized data A using the complementary clock signal as the power source based on the input data DIN. The first switching unit P02 selectively couples the first pull-up driving unit P01 to the output node of the third synchronized data A based on the clock signal CLK. The first pull-down driving unit N01 pull-down drives the output node of the third synchronized data A with a ground voltage VSS based on the input data DIN.

If the third synchronized data A is shifted from the logic high level to the logic low level or from the logic low level to the logic high level, the second transfer unit 211B synchronizes (or senses) the third synchronized data A with the clock signal CLK and outputs a synchronized data as the first synchronized data B.

The second transfer unit 211B receives the complementary clock signal CLKB as the power source. The second transfer unit 211B includes a second pull-up driving unit P03, a second switching unit P04 a second pull-down driving unit N02 and a third switching unit N03. The second pull-up driving unit P03 pull-up drives the output node of the first synchronized data B using the complementary dock signal CLKB as the power source based on the third synchronized data A. The second switching unit P04 selectively couples the second pull-up driving unit P03 to the output node of the first synchronized data B. The second pull-down driving unit N02 pull-down drives the output node of the first synchronized data B with the ground voltage VSS based on the third synchronized data A. The third switching unit N03 selectively couples the second pull-down driving unit N02 to the ground voltage VSS based on the clock signal CLK.

The second synchronization unit 213 synchronizes (or senses) and outputs the first synchronized data B with the complementary clock signal CLKB if the synchronized data B is shifted from the logic low level to the logic high level. The second synchronization unit 213 includes a third pull-up driving unit P05, a third pull-down driving unit N04 and a fourth switching unit P06. The third pull-up driving unit P05 pull-up drives the output node of the second synchronized data C using the clock signal as the power source based on the first synchronized data B. The third pull-down driving unit N04 pull-down drives the output node of the second synchronized data C with the ground voltage VSS based on the first synchronized data B. The fourth switching unit P06 selectively couples the third pull-down driving unit N04 to the output node of the second synchronized data C based on the complementary dock signal CLKB.

The latch unit 215 performs a latch operation with the power supply voltage VDD and the ground voltage VSS (not shown) as the source voltage.

The first signal input circuit 210 may amplify the input data DIN and output the internal input data DIN_INT. For example, if a swing width of the pair of clock signals CLK and CLKB is designed to be larger than that of the input data DIN, an amplification operation of the first signal input circuit 210 may be performed.

Figure 3:
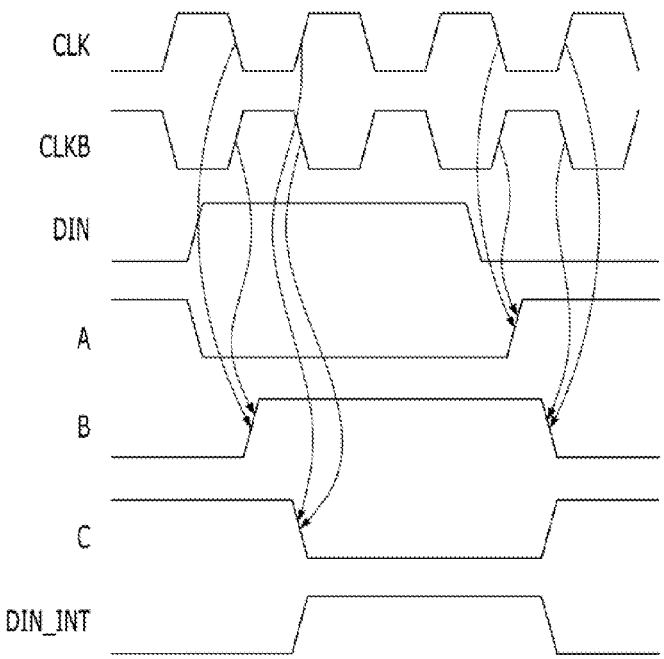
FIG. 3 is a timing diagram illustrating an operation of the first signal input circuit shown in FIG. 2.

FIG. 3 is a timing diagram illustrating an operation of the first signal input circuit 210 shown in FIG. 2.

Referring to FIG. 3, if the input data DIN is inputted from an external device (not shown), the first synchronization unit 211 synchronizes (or senses) the input data DIN with the clock signal CLK and outputs the third synchronized data A.

More specifically, the first transfer unit 211A synchronizes (or senses) the input data DIN with the clock signal CLK and outputs the third synchronized data A only when the input data DIN is shifted from the logic high level to the logic low level. Herein, the first transfer unit 211A uses the complementary clock signal CLKB as the power source. The second transfer unit 211B synchronizes (or senses) the third synchronized data A with the clock signal CLK and outputs the first synchronized data B when the third synchronized data A is shifted from the logic high level to the logic low level or from the logic low level to the logic high level.

Subsequently, the second synchronization unit 213 synchronizes (or senses) the first synchronized data B with the complementary clock signal CLKB and outputs the second synchronized data C only when the first synchronized data B is shifted from the logic low level to the logic high level. The second synchronization unit 213 uses the clock signal as the power source.

Thus, the latch unit 215 latches the second synchronized data C using the power supply voltage VDD and the ground voltage (not shown) as the power source.

Meanwhile, the first signal input circuit 210 minimizes a leakage current in case that the pair of clock signals CLK and CLKB are fixed at a predetermined level. For example, in case that the clock signal CLK is fixed at the logic high level and the complementary clock signal CLKB is fixed at the logic low level, the leakage current generated from the first signal input circuit 210 may be minimized.

Figure 4:
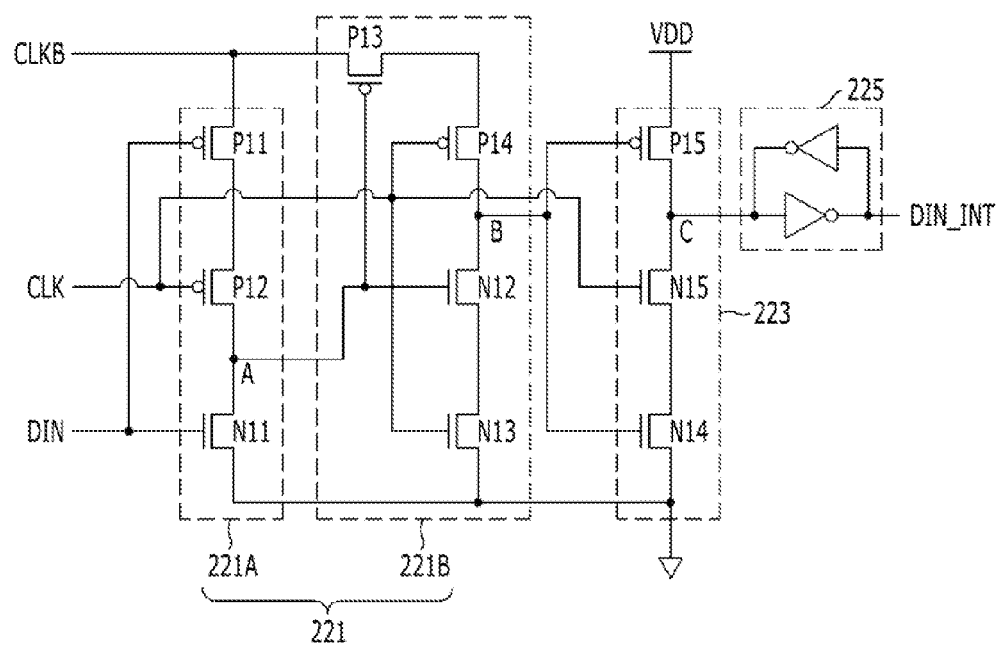
FIG. 4 is a detailed diagram illustrating another example of the first signal input circuit shown in FIG. 1.

Next, FIG. 4 is a detailed diagram illustrating another example of the first signal input circuit 210 shown in FIG. 1.

Referring to FIG. 4, the first signal input circuit 210 includes a first synchronization unit 221, a second synchronization unit 223 and a latch unit 225.

The first synchronization unit 221 synchronizes (or senses) and outputs the input data DIN with the clock signal CLK of a pair of the dock signals CLK and CLKB, and uses the complementary dock signal CLKB as a power source when the input data DIN has a logic low level. The second synchronization unit 223 synchronizes (or senses) and outputs a first synchronized data B outputted from the first synchronization unit 221 with the dock signal CLKB, and uses a power supply voltage VDD as the power source when the first synchronized data B has the logic low level. The latch unit 225 latches a second synchronized data C outputted from the second synchronization unit 223 and outputs the internal input data DIN_INT.

Herein, the first synchronization unit 221 includes a first transfer unit 221A and a second transfer unit 221B. The first transfer unit synchronizes (or senses) the input data DIN with the clock signal CLK and outputs a third synchronized data A having the logic high level if the input data DIN is shifted from the logic high level to the logic low level.

The first transfer unit 221A includes a first pull-up driving unit P11, a first switching unit P12 and a first pull-down driving unit N11. The first pull-up driving unit P11 pull-up drives an output node of the third synchronized data A using the complementary clock signal CLKB as the power source based on the input data DIN. The first switching unit P12 selectively couples the first pull-up driving unit P11 to the output node of the third synchronized data A based on the clock signal CLK. The first pull-down driving nit N11 pull-down drives the output node of the third synchronized data A with a ground voltage HISS based on the input data DIN.

The second transfer unit 221B synchronizes (or senses) the third synchronized data A with the dock signal CLK and outputs the first synchronized data B if the third synchronized data A is shifted from the logic high level to the logic low level or from the logic low level to the logic high level. The second transfer unit 221B uses the complementary clock signal CLKB as the power source, and includes a second pull-up driving unit P13, a second switching unit P14, a second pull-down driving unit N12 and a third switching unit N13.

The second pull-up driving unit P13 pull-up drives the output node of the first synchronized data B using the complementary clock signal CLKB as the power source. The second switching unit P14 selectively couples the second pull-up driving unit P13 to the output node of the first synchronized data B based on the clock signal CLK. The second pull-down driving unit N12 pull-down drives the output node of the first synchronized data B with the ground voltage VSS based on the third synchronized data A. The third switching unit N13 selectively couples the second pull-down driving unit N12 to a ground voltage VSS terminal based on the clock signal CLK.

Subsequently, the second synchronization unit 223 synchronizes (or senses) and outputs the first synchronized data B with the clock signal CLK if the first synchronized data B is shifted from the logic low level to the logic high level. The second synchronization unit 223 includes a third pull-up driving unit P15, a third pull-down driving unit N14, and a fourth switching unit N15.

The third pull-up driving unit P15 pull-up drives the output node of the second synchronized data C using the power supply voltage VDD as the power source based on the first synchronized data B. The third pull-down driving unit N14 pull-down drives the output node of the second synchronized data C with the ground voltage VSS based on the first synchronized data B. The fourth switching unit N15 selectively couples the third pull-down driving unit N14 to the output node of the second synchronized data C based on the clock signal CLK.

The latch unit 225 performs a latch operation using the power supply voltage VDD and the ground voltage VSS (not shown).

The first signal input circuit 210 may amplify the input data DIN and output the internal input data DIN_INT. For example, if a swing width of a pair of clock signals CLK and CLKB is designed to be larger than that of the input data DIN, an amplifying operation of the first signal input circuit 210 may be performed.

Figure 5:
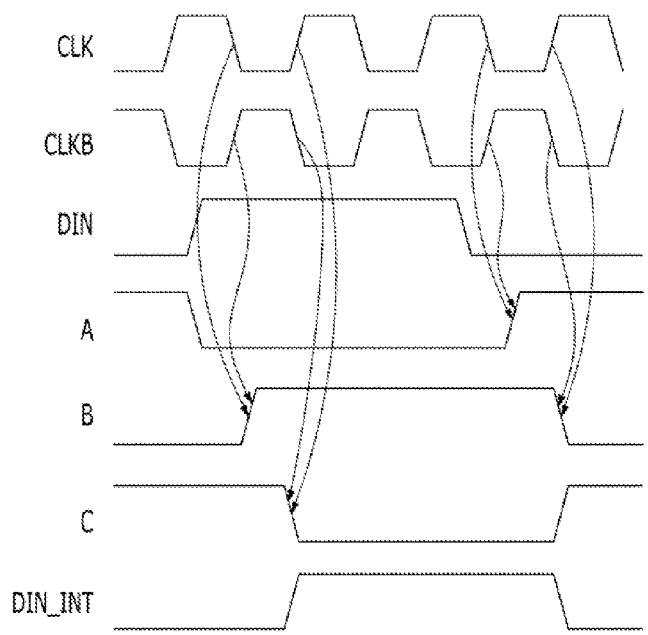
FIG. 5 is a timing diagram illustrating an operation of the first signal input circuit shown in FIG. 4.

FIG. 5 is a timing diagram illustrating an operation of the first signal input circuit 210 shown in FIG. 4.

As shown in FIG. 5, if the input data DIN is inputted from an external device (not shown), the first synchronization unit 221 synchronizes (or senses) the input data DIN with the clock signal CLK and outputs the first synchronized data A.

More specifically, the first transfer unit 221A synchronizes (or senses) the input data DIN with the clock signal CLK and outputs the third synchronized data A only when the input data DIN is shifted from the logic high level to the logic low level. The second transfer unit 221B synchronizes (or senses) the third synchronized data A with the clock signal CLK and outputs the first synchronized data B when the third synchronized data A is shifted from the logic high level to the logic low level.

Herein, the first synchronization unit 221 performs an above-described operation using the complementary clock signal CLKB as the power source. Then, the second synchronization unit 223 synchronizes (or senses) the first synchronized data B with the clock signal CLK and outputs the second synchronized data C only when the first synchronized data B is shifted from the logic low level to the logic high level. Herein, the second synchronization unit 223 performs an above-described operation using the power supply voltage VDD as the power source. Thus, the latch unit 225 latches the second synchronized data C using the power supply voltage VDD as the power source.

Meanwhile, the first signal input circuit 210 may minimize a leakage current in case that the pair of clock signals CLK and CLKB are fixed or floating at a predetermined voltage level. For example, in case that the pair of clock signals are fixed at a logic low level, the leakage current generated from the first signal input circuit 210 may be minimized.

Figure 6:
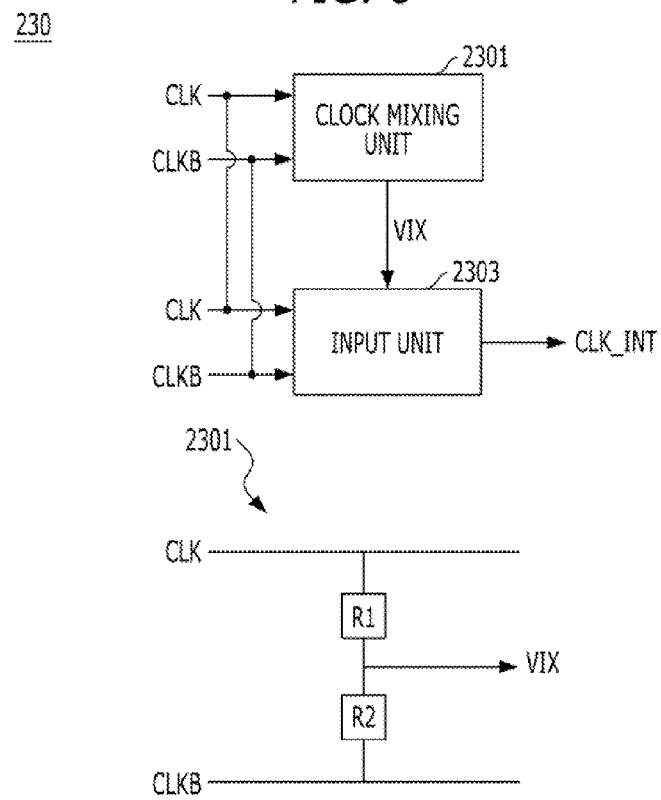
FIG. 6 is a detailed diagram illustrating an example of a second signal input circuit shown in FIG. 1.

FIG. 6 is a detailed diagram illustrating an example of the second signal input circuit 230 shown in FIG. 1.

Referring to FIG. 6, the second signal input circuit 230 includes a clock mixing unit 2301 and an input unit 2303. The clock mixing unit 2301 mixes phases of the pair of clock signals CLK and CLKB. The input unit 2303 receives the clock signal CLK and outputs an internal clock signals CLK_INT using an output signal VIX of the clock mixing unit 2301 as a power source. The input unit 2303 senses the clock signal CLK based on the complementary clock signal CLKB, and thus the internal clock signals CLK_INT corresponds to the clock signal CLK.

More specifically, the clock mixing unit generates a source signal VIX, which is fixed at a predetermined level (corresponding to a cross point of the clock signals CLK and CLKB), by taking an average of the voltage levels of the clock signals CLK and CLKB. For example, the clock mixing unit 2301 includes a first resistor unit R1 and a second resistor unit R2. The first resistor unit R1 is installed between an input terminal of the clock signal CLK and an output terminal of the source signal VIX. The second resistor unit R2 is installed between an input terminal of the complementary clock signal CLKB and the output terminal of the source signal VIX.

Figure 7:
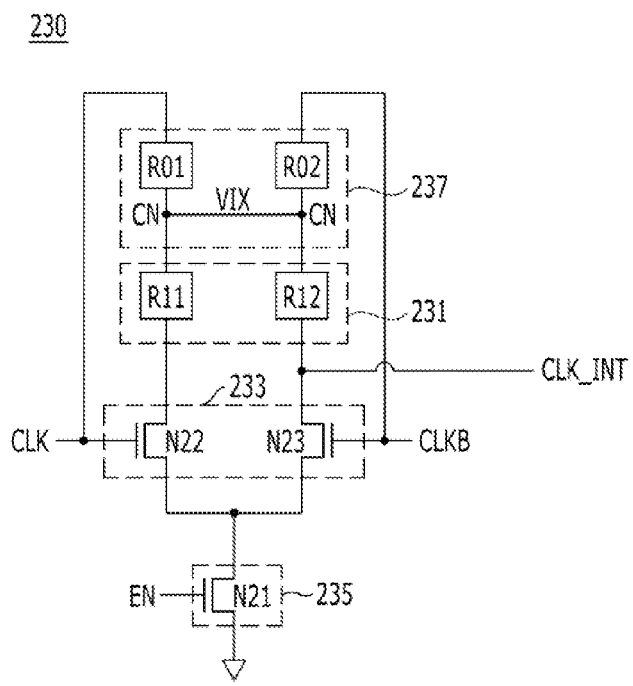
FIG. 7 is a detailed diagram illustrating another example of the second signal input circuit of FIG. 1.

FIG. 7 is a detailed diagram illustrating another example of the second signal input circuit 230 shown in of FIG. 1.

Referring to FIG. 7, the second signal input circuit 230 may include a clock mixing unit 237, a loading unit 231, a differential input unit 233, and a sinking unit 235.

The clock mixing unit 237 mixes the phases of a pair of clock signals CLK and CLKB, and generates a power source having a predetermined voltage level. The differential input unit 233 is installed between a ground voltage VSS terminal and the loading unit 231, and receives the pair of clock signals CLK and CLKB. The sinking unit 235 selectively couples the differential input unit 233 to the ground voltage VSS terminal in response to an enable signal' EN. The sinking unit 235 may include an NMOS transistor N21 operating as a current source.

More specifically, the clock mixing unit 237 may include a first resistor unit R01, a second resistor unit R02. The loading unit 231 may include a third resistor unit R11 and a fourth resistor unit R12.

The first resistor unit R01 is coupled between an input terminal of the clock signal CLK and a common node CM. The second resistor unit R02 is coupled between an input terminal of the complementary clock signal CLKB and the common node CM. The third resistor unit R11 is coupled between the common node CM and the first input unit N22, for example, an NMOS transistor. The fourth resistor unit R12 is coupled between the common node CN and the second input unit N23, for example, an NMOS transistor.

Figure 8:
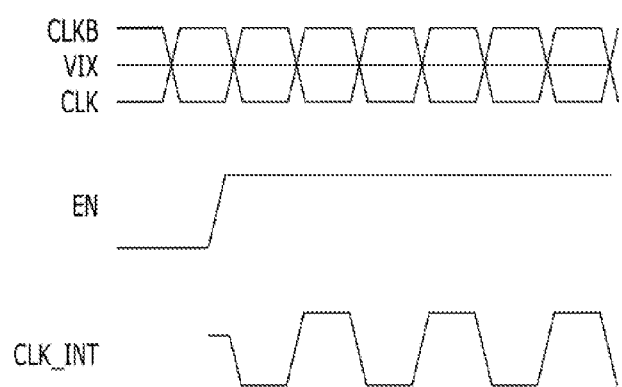
FIG. 8 is a timing diagram illustrating an operation of the second signal input circuit shown in FIG. 7.

FIG. 8 is a timing diagram illustrating an operation of the second signal input circuit 230 shown in FIG. 7.

Referring to FIG. 8, case that the enable signal EN is activated at a logic high level, the second signal input circuit 230 amplifies a voltage difference between the pair of clock signals CLK and CLKB and outputs the internal clock signal CLK_INT. Herein, the second signal input circuit 230 mixes the phases of the pair of clock signals CLK and CLKB and generates a power source VIX having a predetermined voltage level, for example, a voltage level corresponding to a cross point of the pair of clock signals CLK and CLKB. The power source VIX is provided through the common node CN.

As described above, in accordance with embodiments of the present invention, the consumption of the power supply voltage VDD may be reduced by using the pair of clock signals CLK and CLKB as a power source.

If a signal input circuit in accordance with embodiments of the present invention performs an operation at a high speed a dynamic current consumption may be prevented. Especially, in case of a signal input circuit for synchronizing (or sensing) an external signal with an external clock signal and transferring a synchronized signal to an internal circuit, a leakage current may be prevented by controlling the external clock signal to be fixed at a predetermined voltage level.

Thus, a semiconductor system using above-described signal input circuit may minimize a current consumption and may perform an operation at a high speed. Especially, it may be more effective for a semiconductor system including an energy harvesting device such as a solar cell.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
   input pads suitable for inputting an input signal and a pair of clock signals; and
   a signal input circuit suitable for synchronizing the input signal with the pair of clock signals and receiving the pair of clock signals as a power source when the input signal has a first phase, wherein the pair of clock signals are complementary clock signals.

2. The semiconductor device of claim 1, wherein the signal input circuit amplifies a swing width of the input signal based on a swing width of the pair of clock signals.

3. The semiconductor device of claim 1, wherein the signal input circuit comprises:
   a first signal input circuit suitable for receiving the input signal using the pair of clock signals as a synchronization signal and the power source; and
   a second signal input circuit suitable for receiving a first clock signal of the pair of clock signals by using a second clock signal of the pair of clock signals as a differential signal, wherein a voltage that is generated by using the pair of clock signals is used as the power source.

4. A semiconductor device, comprising:
   a first synchronization unit suitable for synchronizing an input signal with a first clock, and for receiving a second clock signal as a power source when the input signal has a first phase;
   a second synchronization unit suitable for synchronizing a first synchronized signal outputted from the first synchronization unit with the second clock signal, and for using the first clock signal as the power source when the first synchronized signal has the first phase; and
   a latch unit suitable for latching a second synchronized signal outputted from the second synchronization unit.

5. The semiconductor device of claim 4, wherein the first clock signal and the second clock signal are differential clocks.

6. The semiconductor device of claim 4, wherein the first synchronization unit comprises:
   a first transfer unit suitable for synchronizing the input signal with the first clock signal and for outputting a third synchronized signal if the input signal is shifted from a second phase to the first phase, wherein the first phase and the second phase are opposite to each other, and the second clock signal is used as the power source; and
   a second transfer unit suitable for synchronizing the third synchronized signal with the first clock signal and for outputting the first synchronized signal if the third synchronized signal is shifted from the first phase to the second phase or from the second phase to the first phase, wherein the second clock signal is used as the power source.

7. The semiconductor device of claim 6, wherein the second synchronization unit synchronizes the first synchronized signal with the second clock signal if the first synchronized signal is shifted from the first phase to the second phase.

8. A semiconductor device, comprising:
   a first synchronization unit suitable for synchronizing an input signal with a first clock signal and for using a second clock signal as a power source when the input signal has a first phase;
   a second synchronization unit suitable for synchronizing a first synchronized signal outputted from the first synchronization unit with the first clock signal and for using a power supply voltage as the power source when the first synchronized signal has the first phase; and
   a latch unit suitable for latching a second synchronized signal outputted from the second synchronization unit.

9. The semiconductor device of claim 8, wherein the first clock signal and the second clock signal are differential clocks.

10. The semiconductor device of claim 8, wherein the first synchronization unit comprises:
    a first transfer unit suitable for synchronizing the input signal with the first clock signal and for outputting a third synchronized signal if the input signal is shifted from a second phase to the first phase, wherein the first phase and the second phase are opposite to each other, and the second clock signal is used as the power source; and
    a second transfer unit suitable for synchronizing the third synchronized signal with the first clock signal and for outputting the first synchronized signal if the third synchronized signal is shifted from the first phase to the second phase or from the second phase to the first phase, wherein the second clock signal is used as the power source.

11. The semiconductor device of claim 10, wherein the second synchronization unit synchronizes the first synchronized signal with the second clock signal if the first synchronized signal is shifted from the first phase to the second phase.

* * * * *